United States Patent
Yang et al.

(10) Patent No.: US 11,605,550 B2
(45) Date of Patent: Mar. 14, 2023

(54) ALIGNMENT SYSTEM

(71) Applicant: XIA TAI XIN SEMICONDUCTOR (QING DAO) LTD., Qingdao (CN)

(72) Inventors: Siwon Yang, Singapore (SG); Jiyong Yoo, Singapore (SG); Byung-In Kwon, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 549 days.

(21) Appl. No.: 16/679,329

(22) Filed: Nov. 11, 2019

(65) Prior Publication Data

US 2020/0219746 A1    Jul. 9, 2020

Related U.S. Application Data

(60) Provisional application No. 62/784,308, filed on Dec. 21, 2018.

(51) Int. Cl.
*H01L 23/544* (2006.01)
*H01L 21/68* (2006.01)
*H01L 21/67* (2006.01)

(52) U.S. Cl.
CPC ........ *H01L 21/68* (2013.01); *H01L 21/67259* (2013.01)

(58) Field of Classification Search
CPC .. H01L 23/544; H01L 21/68; H01L 21/67259
See application file for complete search history.

(56) References Cited

U.S. PATENT DOCUMENTS

2019/0279841 A1* 9/2019 Xiao ................. G01B 15/00

FOREIGN PATENT DOCUMENTS

CN            200983364 Y       11/2007

* cited by examiner

*Primary Examiner* — Jae Lee
(74) *Attorney, Agent, or Firm* — ScienBiziP, P.C.

(57) ABSTRACT

The instant disclosure includes an alignment system. The alignment system includes a first set of alignment marks, a second set of alignment marks, and a third set of alignment marks. The first, second and third alignment marks correspondingly includes a plurality of segments separated into groups. Each of the group being symmetric to a respective other group. The third set of alignment marks are diagonal to the first set of alignment marks and the second set of alignment marks.

18 Claims, 8 Drawing Sheets

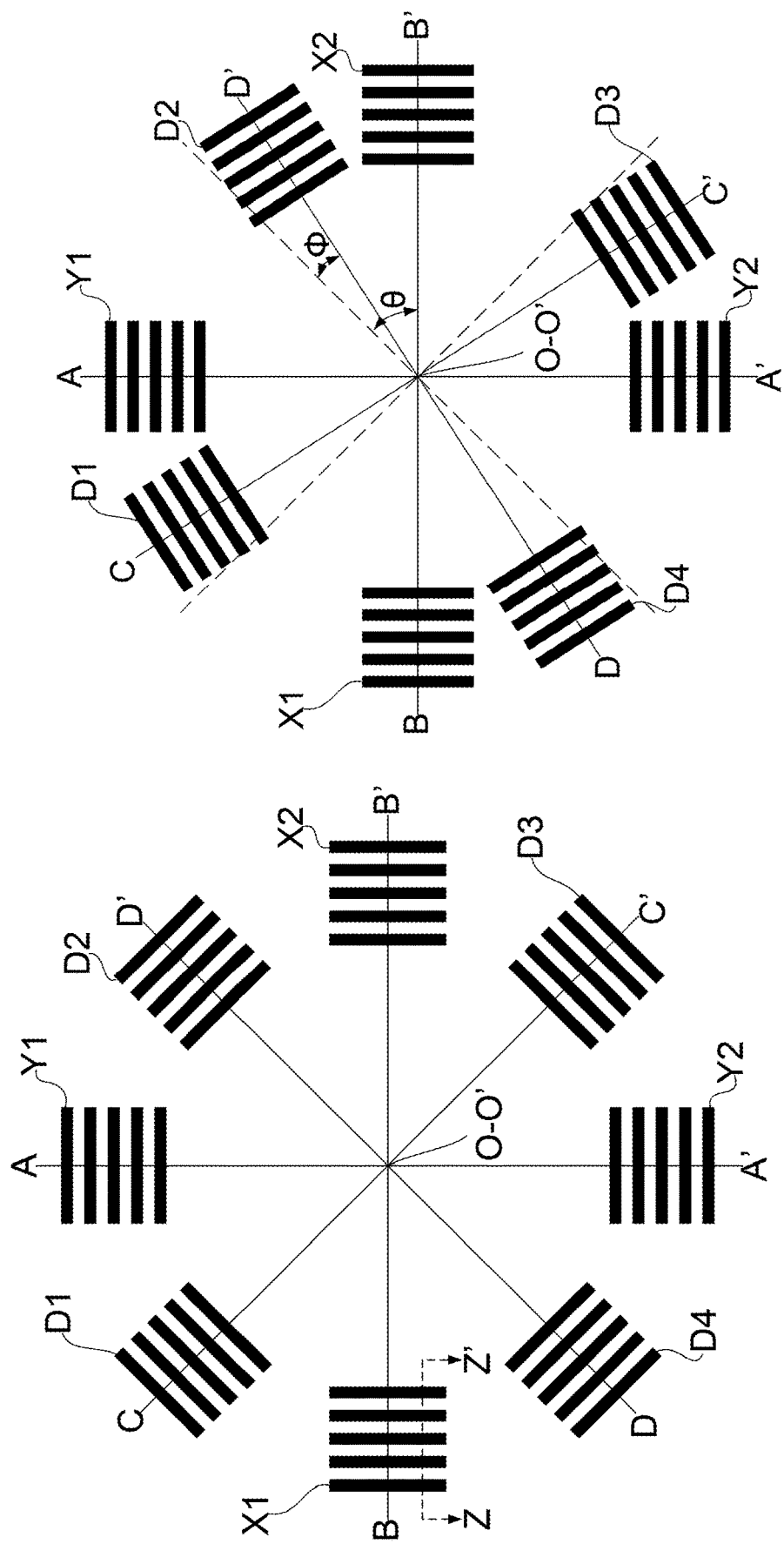

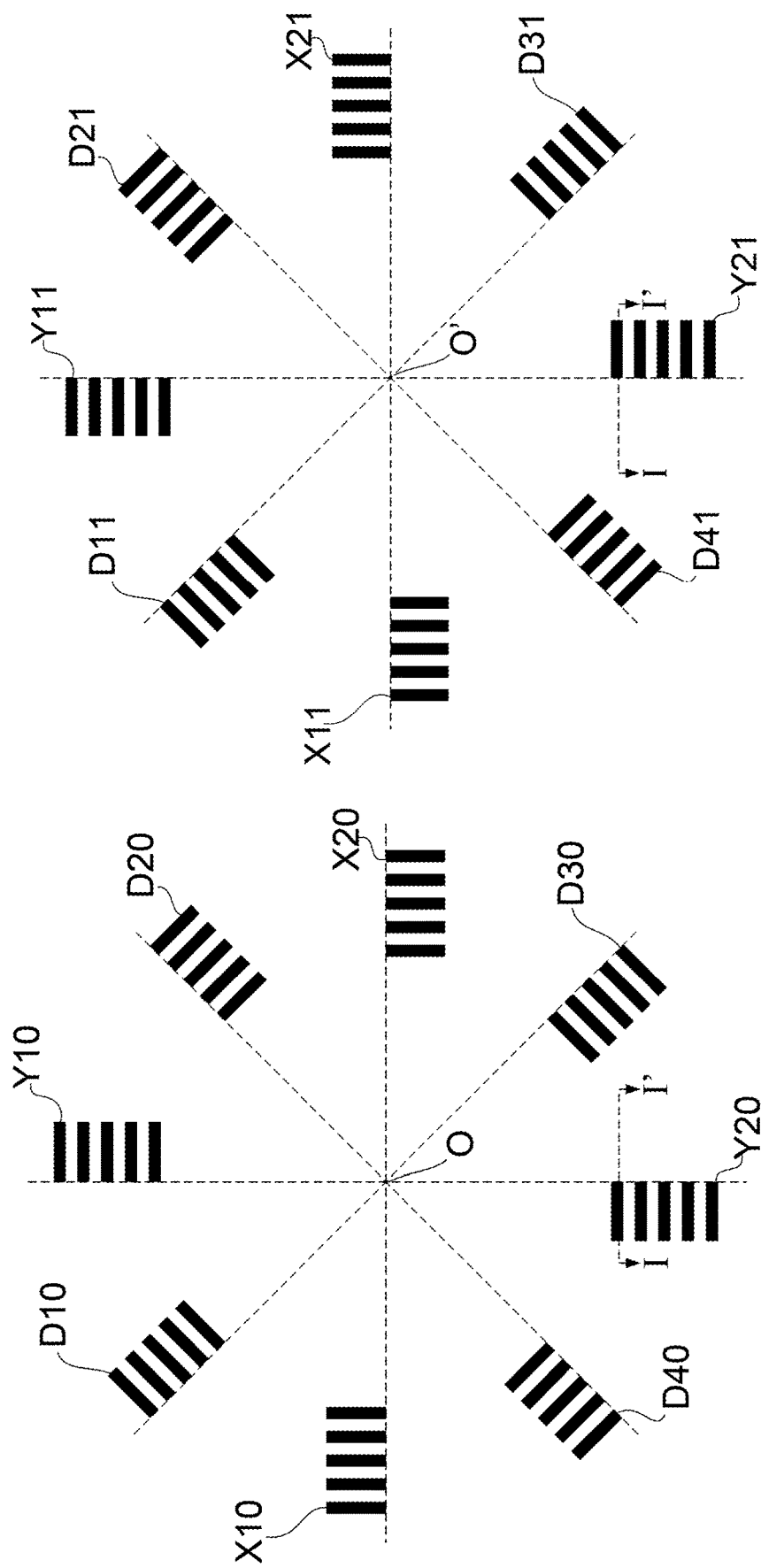

ALIGNMENT SYSTEM

CROSS-REFERENCES TO RELATED APPLICATIONS

This application claims the benefit of U.S. Provisional Patent Application No. 62/784,308 filed on Dec. 21, 2018, which is hereby incorporated by reference herein and made a part of specification.

BACKGROUND

1. Field

The present disclosure generally relates to alignment system, and more particularly, alignment system to increase accuracy of the fabrication process.

2. Related Art

Semiconductor integrated circuits undergo a variety of processing steps during manufacture, such as masking, resist coating, etching, and deposition. In many of these steps, material is overlaid or removed from the existing layer at specific locations in order to form the desired elements of the integrated circuit. Proper alignment of the various process layers is therefore critical.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2A-2C illustrates a top view of an alignment system according to some embodiments of the instant disclosure;

FIG. 4A-4E illustrates a top view of an alignment system according to some embodiments of the instant disclosure;

DETAILED DESCRIPTION

Figure 1:
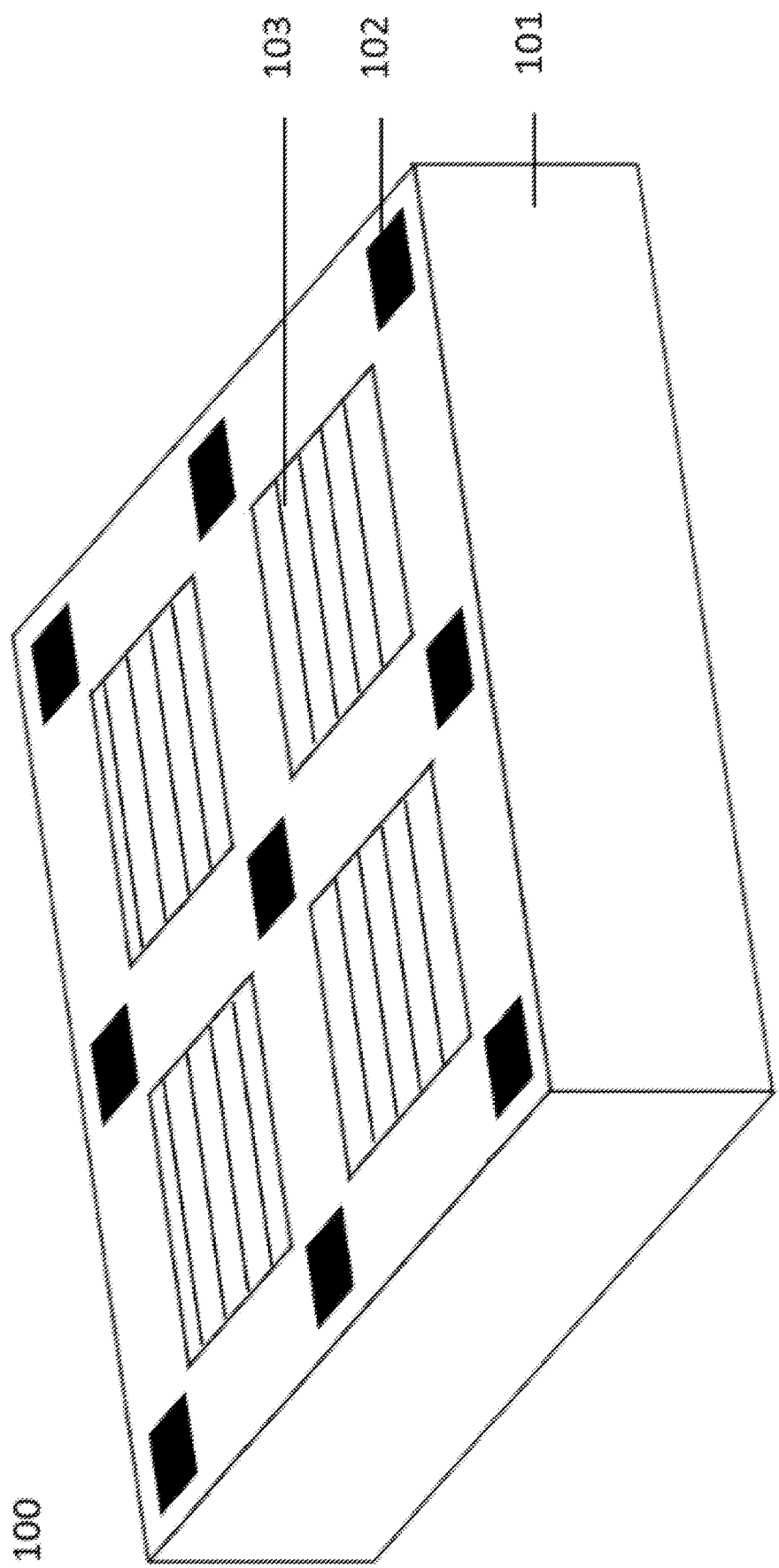
FIG. 1 illustrates a portion of a semiconductor structure according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates a portion of a semiconductor structure 100 according to some embodiments of the instant disclosure. The semiconductor structure 100 includes a substrate 101, an alignment system 102, and an integrated circuit 103. In some embodiments, the substrate 101 includes silicon. Alternatively, the substrate 101 may include germanium, silicon germanium, gallium arsenide or other appropriate semiconductor materials. Also alternatively, the substrate 101 may include at least one of an epitaxial layer, a silicon layer, and a silicon dioxide layer. The alignment system 102 and the integrated circuit 103 are formed on the substrate 101. In some embodiments, the alignment system 102 may be formed on at least one corner of the substrate 101. In some embodiments, the alignment system 102 may be formed on at least one corner of integrated circuit 103. In some embodiments, the alignment system 102 may be formed in between neighboring integrated circuits 103. In some embodiments, the first set of alignment marks, the second set of alignment marks, and the third set of alignment mark are disposed on a center of the substrate 101.

Figure 2C:
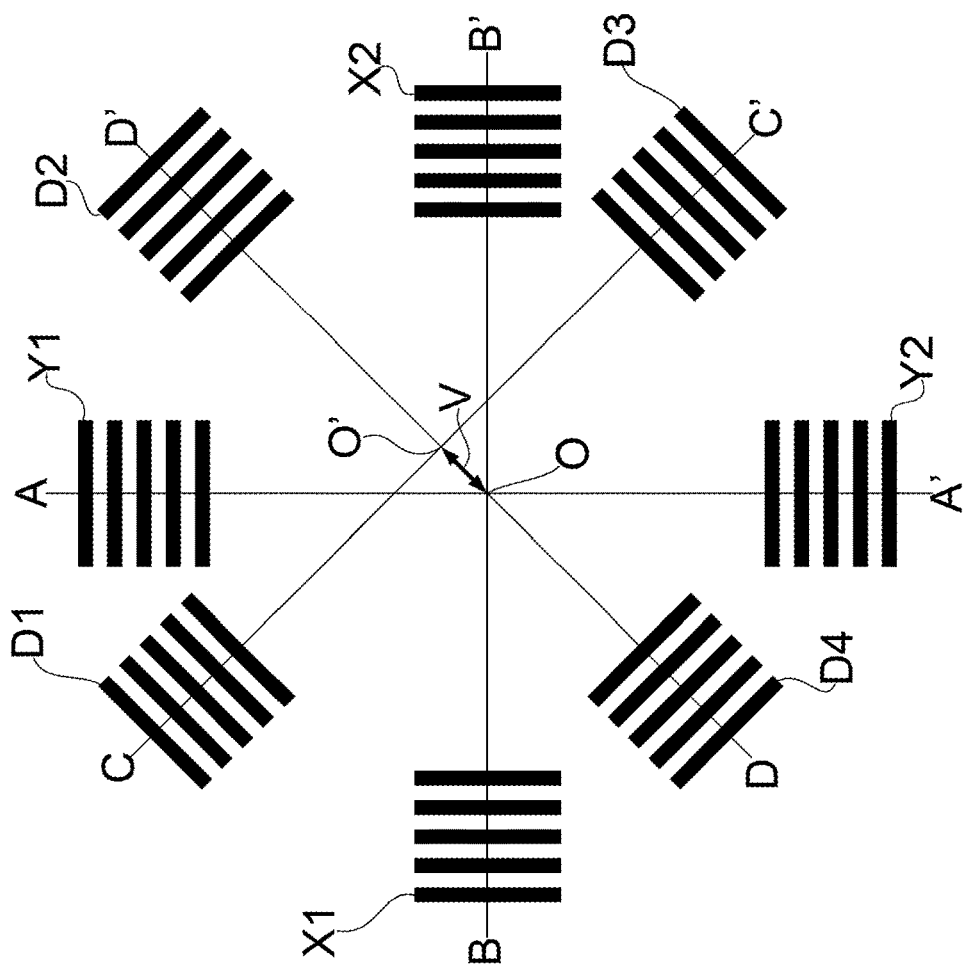

FIG. 2A-2C illustrates a top view of an alignment system according to some embodiments of the instant disclosure. The alignment system comprises a first set of alignment marks, a second set of alignment marks orthogonal to the first set of alignment marks, and a third set of alignment marks diagonal to the first set of alignment marks and the second set of alignment marks. The first set of alignment marks has a plurality of segments X1, X2 separated into groups. The groups of the first set of alignment marks are symmetric to each other. The second set of alignment marks has a plurality of segments Y1, Y2 separated into groups. The groups of the second set of alignment marks are symmetric to each other. The third set of alignment marks have a plurality of segments D1, D2, D3, D4 separated into groups. The groups of the third set of alignment marks are orthogonal to a respective neighboring group thereof.

In some embodiments, a first marking group includes the first set of alignment marks and the second set of alignment marks. In some embodiments, a second marking group includes the third set of alignment marks. In some embodiments, the first marking group are formed on a different layer from the second marking group, such as different epitaxial layers, different metal layers, or dielectric layers. In some embodiments, the first marking group are formed on a same layer with the second marking group, such as n-type and p-type dopants in the substrate.

In some embodiments, the plurality of segments of the first set of alignment marks, the second set of alignment marks, and the third set of alignment marks have substantially similar length and width.

When the first marking group is aligned with the second marking group, the angular distance θ between the first marking group and the second marking group is about 45 degrees. As shown in FIG. 2B, when the first marking group is misaligned with the second marking group, an angular tolerance Φ may occur. In some embodiments, the angular tolerance Φ between the first marking group and the second marking group is less than 1 degree.

As shown in FIG. 2C, when the first marking group is misaligned with the second marking group, a translational tolerance V may occur. The translational tolerance V may be the distance between a center point O' the third set of alignment marks and a center point O formed by the first set of alignment marks and the second set of alignment marks. The translational tolerance V is less 61 μm.

Figure 3A:
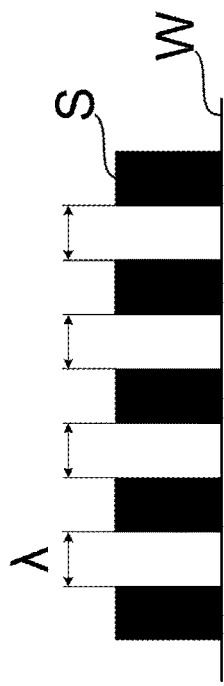
FIG. 3A-3C illustrates a cross sectional view of a portion of an alignment system according to some embodiments of the instant disclosure.
Figure 3B:
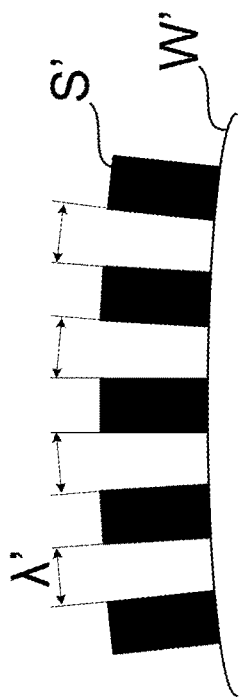
Figure 3C:
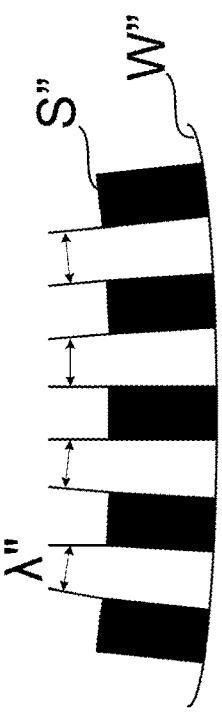

FIGS. 3A-3C illustrates a cross sectional view of a portion of an alignment system according to some embodiments of the instant disclosure. The cross sectional view may be taken along the Z-Z' line in FIG. 2A. In some embodiments, the plurality of segments S in each of the groups are equidistant from a respective neighboring segment. In some embodiments, when the substrate W has no warpage, the distance λ between neighboring segment S are the same to each other. In some embodiments, when the substrate W' has warpage, the distance λ' between neighboring segment S' are greater than the distance λ when the substrate W has no warpage. In some other embodiments, when the substrate W" has warpage, the distance λ' between neighboring segment S" are less than the distance λ when the substrate W has no warpage.

FIGS. 4A-4E illustrates a top view of an alignment system according to some embodiments of the instant disclosure. The alignment system comprises a first set of alignment marks, a second set of alignment marks orthogonal to the first set of alignment marks, and a third set of alignment marks diagonal to the first set of alignment marks and the second set of alignment marks. The first set of alignment marks has a plurality of segments X10, X20, X11, X21 separated into groups. The groups of the first set of alignment marks are symmetric to each other. The second set of alignment marks has a plurality of segments Y10, Y20, Y11, Y21 separated into groups. The groups of the second set of alignment marks are symmetric to each other. The third set of alignment marks have a plurality of segments D10, D20, D30, D40, D11, D21, D31, D41 separated into groups. The groups of the third set of alignment marks are orthogonal to a respective neighboring group thereof.

In some embodiments, a first marking group includes a half of the first set of alignment marks, a half of the second set of alignment marks, and a half of the third set of alignment marks. A second marking group includes another half of the first set of alignment marks, another half of the second set of alignment marks, and another half of the third set of alignment marks. In some embodiments, the first marking group are formed on a different layer from the second marking group, such as different epitaxial layers, different metal layers, or dielectric layers. In some embodiments, the first marking group are formed on a same layer with the second marking group, such as n-type and p-type dopants in the substrate.

In some embodiments, the plurality of segments of the first set of alignment marks, the second set of alignment marks, and the third set of alignment marks have substantially similar length and width.

In some embodiments, the plurality of segments of the first set of alignment marks, the second set of alignment marks, and the third set of alignment marks have substantially similar length and width.

Figure 4D:
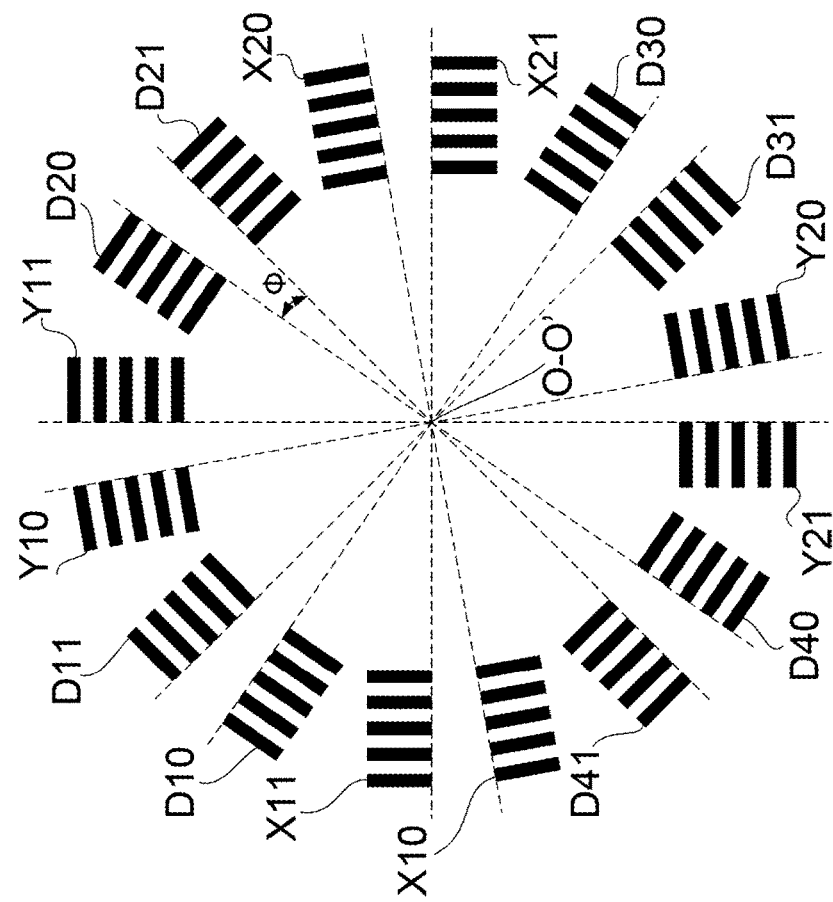
Figure 4C:
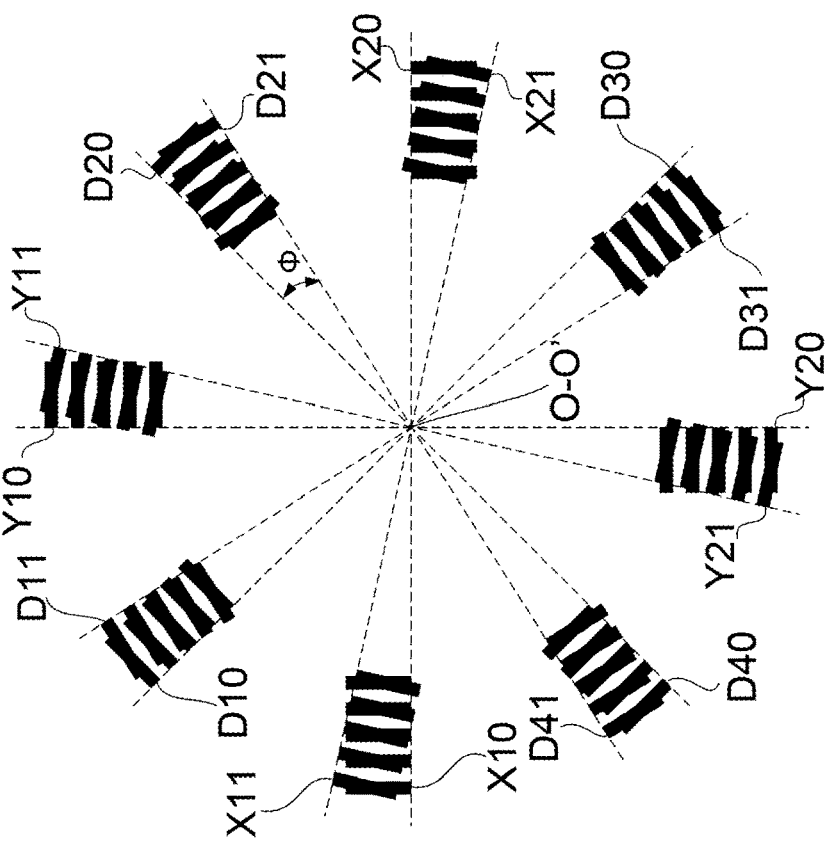

As shown in FIGS. 4C and 4D, when the first marking group is misaligned with the second marking group, an angular tolerance Φ may occur. In some embodiments, the angular tolerance Φ between the first marking group and the second marking group is less than 1 degree.

Figure 4E:
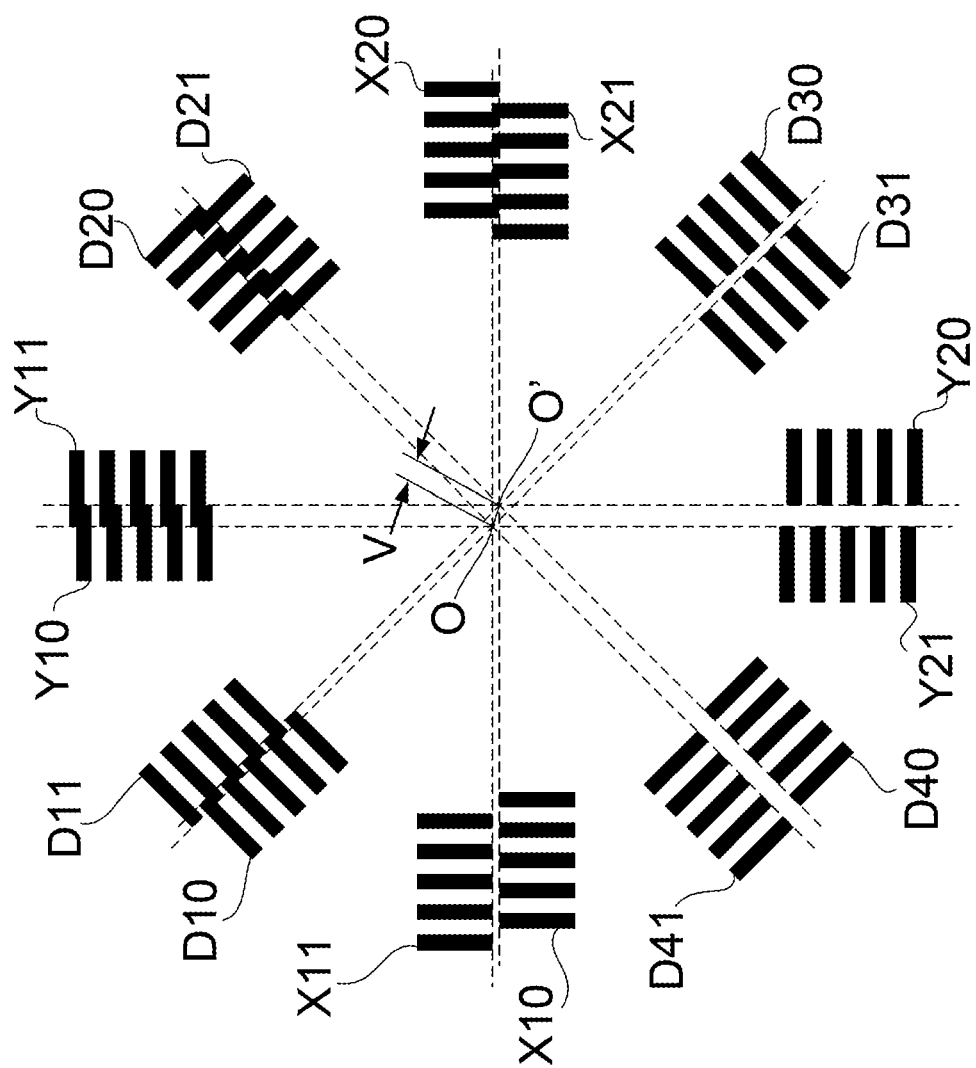

As shown in FIG. 4E, when the first marking group is misaligned with the second marking group, a translational tolerance V may occur. The translational tolerance V may be the distance between a center point O' the third set of alignment marks and a center point O formed by the first set of alignment marks and the second set of alignment marks. The translational tolerance V is less than 1 μm.

Figure 5:
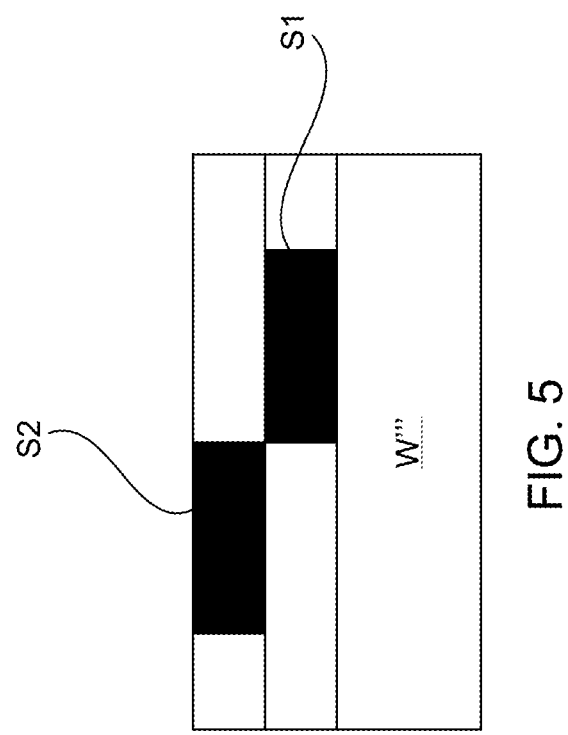
FIG. 5 illustrates a cross sectional view of an alignment system according to some embodiments of the instant disclosure.

FIG. 5 illustrates a cross sectional view of an alignment system according to some embodiments of the instant disclosure. The cross sectional view may be taken along the I-I' line in FIGS. 4A and 4B. The first marking group in FIG. 4A may be disposed over the second marking group in FIG. 4B. In some embodiments, the segment S1 and the segment S2 are disposed over the substrate W'''. When the first marking group in FIG. 4A and the second marking group in FIG. 4B are substantially aligned, the planar distance may be substantially zero. When the first marking group in FIG. 4A and the second marking group in FIG. 4B are not aligned, the segment S1 and the segment S2 may be planarly at a distance from each other or may be overlapping with each other. In some embodiments, the segment S1 are disposed over the segment S2. In some other embodiment, the segment S1 are disposed below the segment S2.

Figure 6:
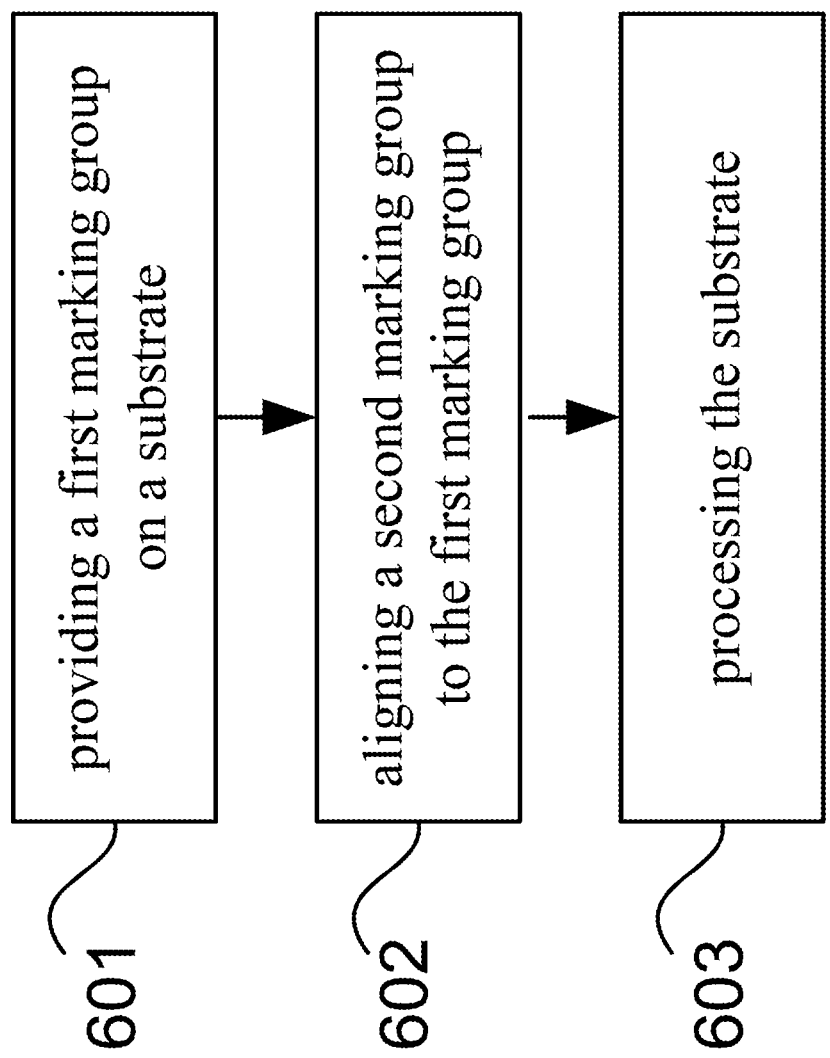
FIG. 6 illustrates a method of determining misalignment using alignment marks according to some embodiments of the instant disclosure.

FIG. 6 illustrates a method of determining misalignment using alignment marks according to some embodiments of the instant disclosure. The method of determining misalignment using alignment marks includes providing a first marking group on a substrate (601), aligning a second marking group to the first marking group (602), and processing the substrate (603). A combination of the first marking group and the second marking group comprises a first set of alignment marks, a second set of alignment marks, and a third set of alignment mark. The third set of alignment marks are positioned to be diagonal to the first set of alignment marks and the second set of alignment marks. The first set of alignment marks has a plurality of segments separated into groups. The groups of the first set are symmetric to each other. The second set of alignment marks has a plurality of segments separated into groups. The groups of the second set are symmetric to each other. The third set of alignment marks have a plurality of segments separated into groups. The groups of the third set of alignment marks are orthogonal to a respective neighboring group thereof.

In some embodiments, the first marking group comprises the first set of alignment marks and the second set of alignment marks, the second marking group comprises the third set of alignment marks, the first marking group being forms on a different layer from the second marking group.

In some embodiments, the first marking group comprises a half of the first set of alignment marks, a half of the second set of alignment marks, and a half of the third set of alignment marks, the second marking group comprises another half of the first set of alignment marks, another half of the second set of alignment marks, and another half of the third set of alignment marks, the first marking group being forms on a different layer from the second marking group.

In some embodiments, the method of determining misalignment using alignment marks further includes determining a rotational displacement between the first marking groups and the second marking groups. A tolerance range of the rotational displacement is less than 1 degree.

In some embodiments, the method of determining misalignment using alignment marks further includes determining a translational displacement between a center point of the first marking group and a center point of the second marking group when the center point of the first marking group is misaligned with the center point of the second marking group.

The first set of alignment marks and the second set of alignment marks form quadrants. During alignment of the third set of alignment marks, the third set of alignment marks and a position of the third set of alignment marks is adjusted during aligning when a center point of the third set of alignment marks is positioned in one of the quadrants.

In some embodiments, the position of the third set of alignment marks is adjusted according to a distance of the center point of the third set of alignment marks from the center point of the first set of alignment marks and the second set of alignment marks.

In some embodiments, adjustment of the position of the third set of alignment marks is completed when the translational displacement between the center point of the third set of alignment marks and the center point formed by the first set of alignment marks and the second set of alignment marks is within a displacement tolerance, the displacement tolerance is less than 1 μm.

In some embodiments, the second marking group is adjusted during aligning when a shape of the groups is deformed. In some embodiments, the first set of alignment marks, the second set of alignment marks, and the third set of alignment mark are disposed on a center of the substrate. In some embodiments, a warpage of the substrate is determined. The plurality of segments in each of the groups are equidistant from a respective neighboring segment when initially formed on the substrate and a change in a distance between equidistant segments indicates the warpage of the substrate. The alignment marks disposed in the center of the substrate is used to determine the direction of which the substrate is warped. The groups of segments in the alignment mark form a circular pattern. Each of the group may reflect a direction of the substrate. According to which group of segments is deformed and how the segments are deformed, such as shown in FIGS. 3A-3C, the direction and section of the substrate that is deformed may be determined.

A metrology program run by a processor forms center lines (such as A-A', B-B', C-C', D-D' in FIG. 2A) across the middle of the segments of the alignment marks. The center lines are used to determine alignment between the alignment marks. The alignment procedure may include both centering and positioning. The centering and positioning may be measured simultaneously or sequentially. The alignment system is not limited to being used in lithography process. Other semiconductor process can utilize the alignment system to determine the condition of the substrate being processed.

Accordingly, one aspect of the instant disclosure provides an alignment system that comprises a first set of alignment marks having a plurality of segments separated into groups, the groups being symmetric to each other; a second set of alignment marks orthogonal to the first set of alignment marks, the second set of alignment marks having a plurality of segments separated into groups, the groups being symmetric to each other; and a third set of alignment marks diagonal to the first set of alignment marks and the second set of alignment marks, the third set of alignment marks having a plurality of segments separated into groups and the groups are orthogonal to a respective neighboring group thereof.

In some embodiments, a first marking group comprises the first set of alignment marks and the second set of alignment marks, a second marking group comprises the third set of alignment marks, the first marking group being formed on a different layer from the second marking group.

In some embodiments, an angular tolerance between the first marking group and the second marking group is less than 1 degree.

In some embodiments, a first marking group comprises a half of the first set of alignment marks, a half of the second set of alignment marks, and a half of the third set of alignment marks, a second marking group comprises another half of the first set of alignment marks, another half of the second set of alignment marks, and another half of the third set of alignment marks, the first marking group being formed on a different layer from the second marking group.

In some embodiments, an angular tolerance between the first marking group and the second marking group is less than 1 degree.

In some embodiments, the plurality of segments of the first set of alignment marks, the second set of alignment marks, and the third set of alignment marks have substantially similar length and width.

In some embodiments, a translational tolerance between a center point the third set of alignment marks and a center point formed by the first set of alignment marks and the second set of alignment marks is less than 1 μm.

In some embodiments, the plurality of segments in each of the groups are equidistant from a respective neighboring segments.

Accordingly, another aspect of the instant disclosure provides a method of determining misalignment using alignment marks that comprises providing a first marking group on a substrate; aligning a second marking group to the first marking group; and processing the substrate. A combination of the first marking group and the second marking group comprises a first set of alignment marks, a second set of alignment marks, and a third set of alignment mark, the third set of alignment marks are positioned to be diagonal to the first set of alignment marks and the second set of alignment marks, the first set of alignment marks has a plurality of segments separated into groups, the groups of the first set being symmetric to each other, the second set of alignment marks has a plurality of segments separated into groups, the groups of the second set being symmetric to each other, and the third set of alignment marks having a plurality of segments separated into groups and the groups of the third set of alignment marks are orthogonal to a respective neighboring group thereof.

In some embodiments, the first marking group comprises the first set of alignment marks and the second set of alignment marks, the second marking group comprises the third set of alignment marks, the first marking group being forms on a different layer from the second marking group.

In some embodiments, the first marking group comprises a half of the first set of alignment marks, a half of the second set of alignment marks, and a half of the third set of alignment marks, the second marking group comprises another half of the first set of alignment marks, another half of the second set of alignment marks, and another half of the third set of alignment marks, the first marking group being forms on a different layer from the second marking group.

In some embodiments, the method of determining misalignment using alignment marks further comprises determining a rotational displacement between the first marking groups and the second marking groups.

In some embodiments, a tolerance range of the rotational displacement ranges is less than 1 degree.

In some embodiments, the method of determining misalignment using alignment marks further comprises determining a translational displacement between a center point of the first marking group and a center point of the second marking group when the center point of the first marking group is misaligned with the center point of the second marking group.

In some embodiments, the first set of alignment marks and the second set of alignment marks form quadrants and a position of the third set of alignment marks is adjusted during aligning when a center point of the third set of alignment marks is positioned in one of the quadrants.

In some embodiments, the position of the third set of alignment marks is adjusted according to a distance of the center point of the third set of alignment marks from the center point of the first set of alignment marks and the second set of alignment marks.

In some embodiments, adjustment of the position of the third set of alignment marks is completed when the translational displacement between the center point of the third set of alignment marks and the center point formed by the first set of alignment marks and the second set of alignment marks is within a displacement tolerance, the displacement tolerance is less than 1 μm.

In some embodiments, the second marking group is adjusted during aligning when a shape of the groups are deformed.

In some embodiments, the first set of alignment marks, the second set of alignment marks, and the third set of alignment mark are disposed on a center of the substrate.

In some embodiments, the method of determining misalignment using alignment marks further comprises determining a warpage of the substrate. The plurality of segments in each of the groups are equidistant from a respective neighboring segments when initially formed on the substrate and a change in a distance between equidistant segments indicates the warpage of the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An alignment system, comprising:
    a first set of alignment marks having a plurality of segments separated into groups, the groups being symmetric to each other;
    a second set of alignment marks orthogonal to the first set of alignment marks, the second set of alignment marks having a plurality of segments separated into groups, the groups being symmetric to each other; and
    a third set of alignment marks diagonal to the first set of alignment marks and the second set of alignment marks, the third set of alignment marks having a plurality of segments separated into groups and the groups are orthogonal to a respective neighboring group thereof;
    wherein a first marking group comprises the first set of alignment marks and the second set of alignment marks, a second marking group comprises the third set of alignment marks, the first marking group being formed on a different layer from the second marking group.

2. The system of claim 1, wherein an angular tolerance between the first marking group and the second marking group is less than 1 degree.

3. The system of claim 1, wherein a first marking group comprises a half of the first set of alignment marks, a half of the second set of alignment marks, and a half of the third set of alignment marks, a second marking group comprises another half of the first set of alignment marks, another half of the second set of alignment marks, and another half of the third set of alignment marks, the first marking group being formed on a different layer from the second marking group.

4. The system of claim 3, wherein an angular tolerance between the first marking group and the second marking group is less than 1 degree.

5. The system of claim 1, wherein the plurality of segments of the first set of alignment marks, the second set of alignment marks, and the third set of alignment marks have substantially similar length and width.

6. The system of claim 1, wherein a translational tolerance between a center point the third set of alignment marks and a center point formed by the first set of alignment marks and the second set of alignment marks is less than 1 μm.

7. The system of claim 1, wherein the plurality of segments in each of the groups are equidistant from a respective neighboring segments.

8. A method of determining misalignment using alignment marks, comprising:
    providing a first marking group on a substrate;
    aligning a second marking group to the first marking group; and
    processing the substrate;
    wherein a combination of the first marking group and the second marking group comprises a first set of alignment marks, a second set of alignment marks, and a third set of alignment mark, the third set of alignment marks are positioned to be diagonal to the first set of alignment marks and the second set of alignment marks, the first set of alignment marks has a plurality of segments separated into groups, the groups of the first set being symmetric to each other, the second set of alignment marks has a plurality of segments separated into groups, the groups of the second set being symmetric to each other, and the third set of alignment marks having a plurality of segments separated into groups and the groups of the third set of alignment marks are orthogonal to a respective neighboring group thereof;
    wherein the first marking group comprises the first set of alignment marks and the second set of alignment marks, the second marking group comprises the third set of alignment marks, the first marking group being forms on a different layer from the second marking group.

9. The method of claim 8, wherein the first marking group comprises a half of the first set of alignment marks, a half of the second set of alignment marks, and a half of the third set of alignment marks, the second marking group comprises another half of the first set of alignment marks, another half of the second set of alignment marks, and another half of the third set of alignment marks, the first marking group being forms on a different layer from the second marking group.

10. The method of claim 8, further comprising:
determining a rotational displacement between the first marking groups and the second marking groups.

11. The method of claim 10, wherein a tolerance range of the rotational displacement is less than 1 degree.

12. The method of claim 8, further comprising:
determining a translational displacement between a center point of the first marking group and a center point of the second marking group when the center point of the first marking group is misaligned with the center point of the second marking group.

13. The method of claim 12, wherein the first set of alignment marks and the second set of alignment marks form quadrants and a position of the third set of alignment marks is adjusted during aligning when a center point of the third set of alignment marks is positioned in one of the quadrants.

14. The method of claim 13, wherein the position of the third set of alignment marks is adjusted according to a distance of the center point of the third set of alignment marks from the center point of the first set of alignment marks and the second set of alignment marks.

15. The method of claim 14, wherein adjustment of the position of the third set of alignment marks is completed when the translational displacement between the center point of the third set of alignment marks and the center point formed by the first set of alignment marks and the second set of alignment marks is within a displacement tolerance, the displacement tolerance is less than 1 µm.

16. The method of claim 12, wherein the second marking group is adjusted during aligning when a shape of the groups are deformed.

17. The method of claim 8, wherein the first set of alignment marks, the second set of alignment marks, and the third set of alignment mark are disposed on a center of the substrate.

18. The method of claim 8, further comprising:
determining a warpage of the substrate;
wherein the plurality of segments in each of the groups are equidistant from a respective neighboring segments when initially formed on the substrate and a change in a distance between equidistant segments indicates the warpage of the substrate.

* * * * *